United States Patent [19]
Todoroki

[11] Patent Number: 5,457,705
[45] Date of Patent: Oct. 10, 1995

[54] METHOD OF AND SYSTEM FOR DATA TRANSMISSION EMPLOYING TRELLIS CODED MODULATION

[75] Inventor: Toshiya Todoroki, Tokyo, Japan

[73] Assignee: NEC Corporation, Japan

[21] Appl. No.: 124,932

[22] Filed: Sep. 21, 1993

[30] Foreign Application Priority Data

Sep. 22, 1992 [JP] Japan ................................. 4-252437

[51] Int. Cl.$^6$ ................................................ H03M 13/12
[52] U.S. Cl. ............................................................ 371/43
[58] Field of Search ............................... 375/17, 39, 59, 375/27; 371/43

[56] References Cited

U.S. PATENT DOCUMENTS

| | | | |
|---|---|---|---|
| 4,493,082 | 1/1985 | Cumberton et al. | 375/39 |
| 4,586,182 | 4/1986 | Gallager | 375/39 |
| 4,945,549 | 7/1990 | Simon et al. | 371/43 |
| 5,291,521 | 3/1994 | Betts et al. | 375/59 |
| 5,301,209 | 4/1994 | Wei | 375/39 |

*Primary Examiner*—Stephen M. Baker
*Attorney, Agent, or Firm*—Ostrolenk, Faber, Gerb & Soffen

[57] ABSTRACT

A data transmission system for transmitting data by way of encoding modulation has a transmitter including a convolutional encoder and a receiver including a Viterbi decoder. For the case when the bit rate is changed, the data transmission system employs the same modulator/demodulator, and effectively utilizes a frequency band which is unchanged. The transmitter includes a selector for periodically switching two output signals, one having a redundant bit produced from the convolutional encoder and the other having an information bit instead of a redundant bit, resulting in a variable encoding ratio. The Viterbi decoder decodes a designated signal from the convolutional encoder. The receiver also includes a circuit for reconstructing branch metrics only when a received symbol composed of only an information bit without a redundant bit is supplied, and circuits for regenerating a information bit which is added without depending on the encoding.

2 Claims, 9 Drawing Sheets

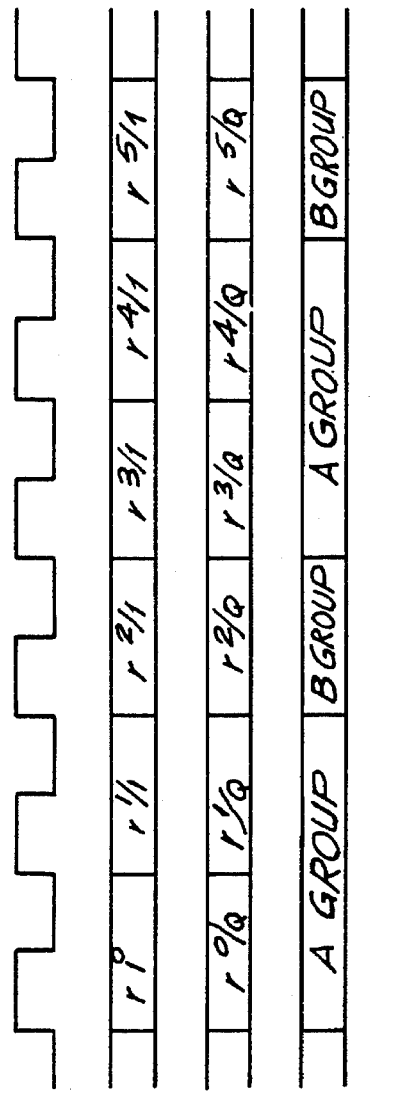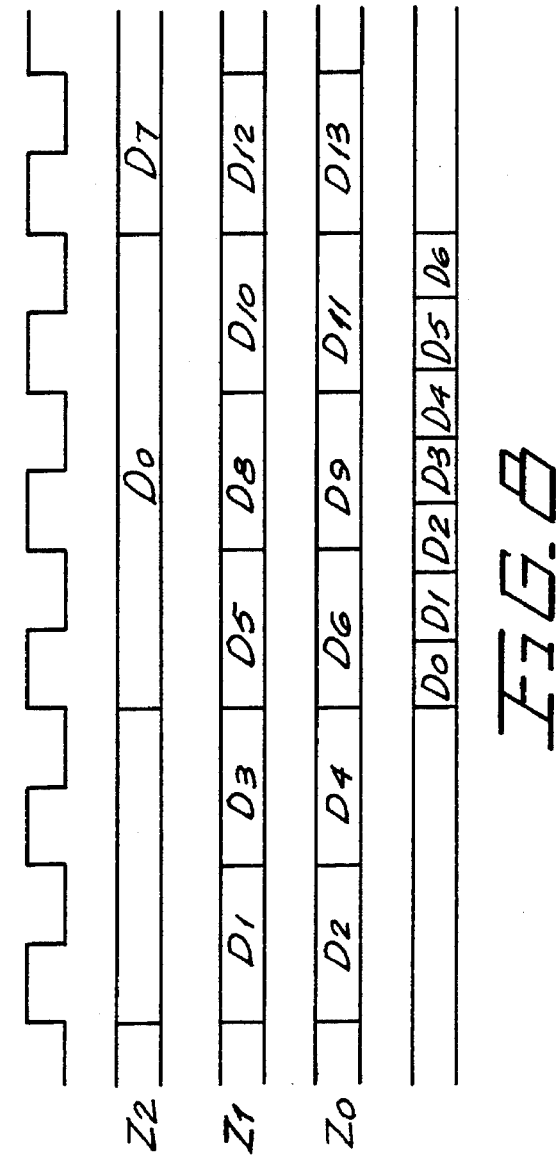

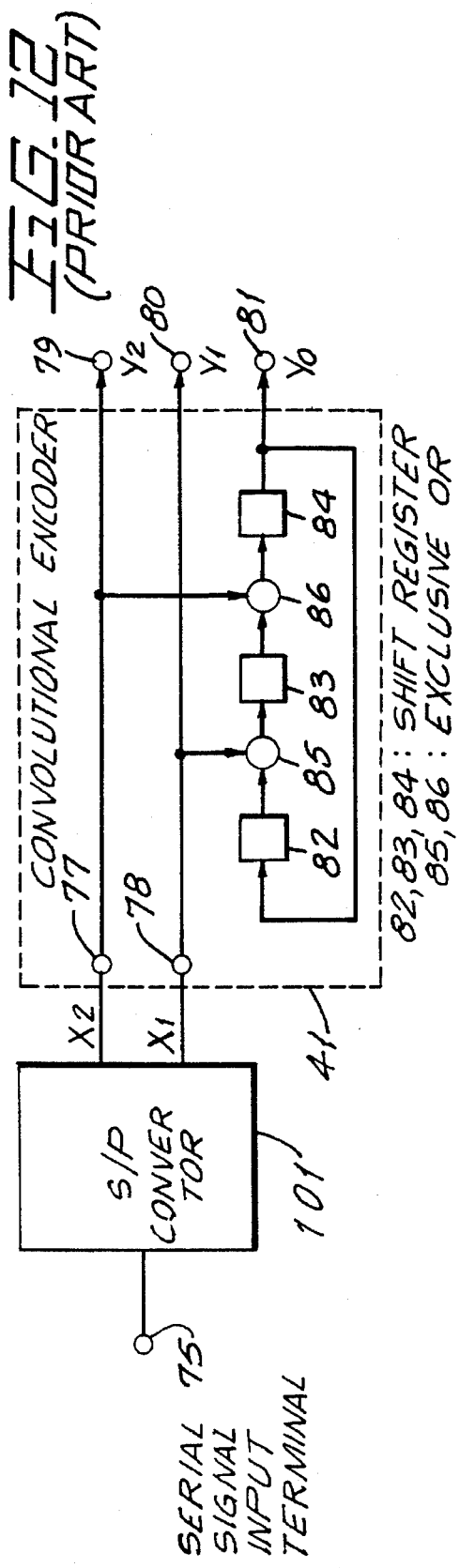
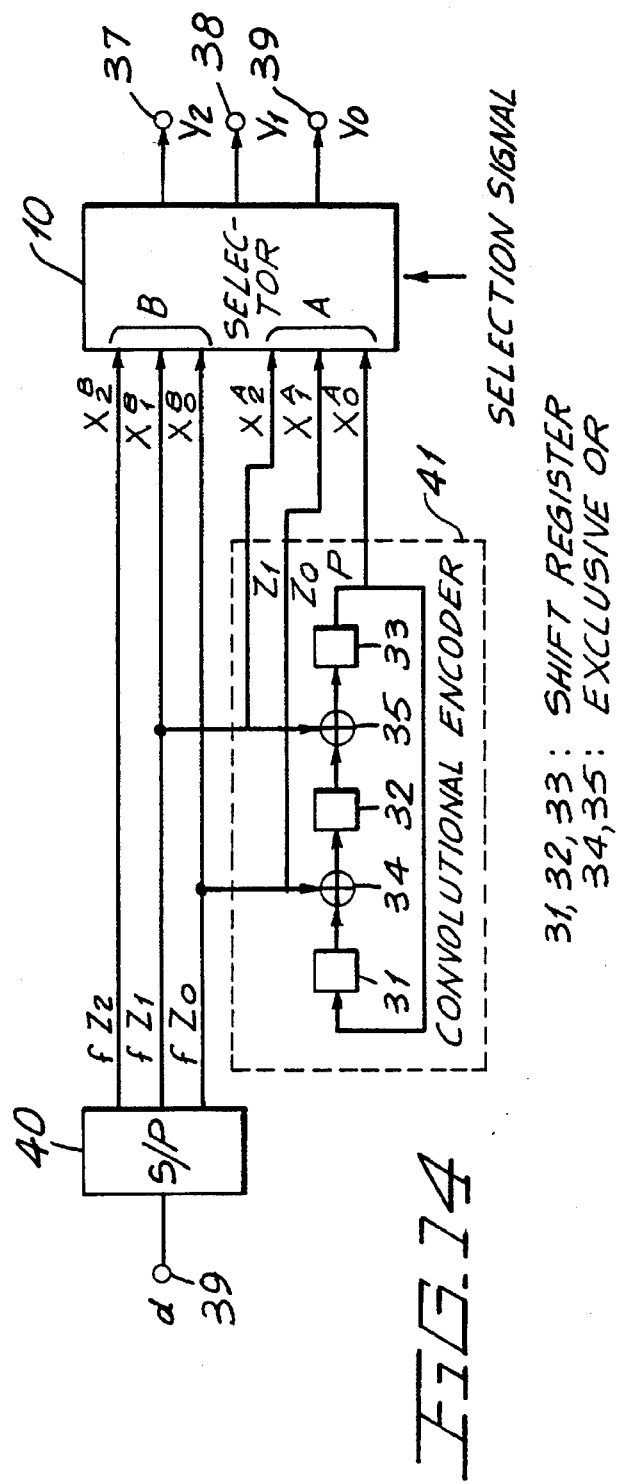

METHOD OF AND SYSTEM FOR DATA TRANSMISSION EMPLOYING TRELLIS CODED MODULATION

BACKGROUND OF THE INVENTION

1. Field of the Invention

The present invention relates to a method of and a system for data transmission, employing trellis coded modulation and more particularly to a method of and a system for data transmission through a convolutional encoder, a Viterbi decoder, and a multiphase or multilevel digital radio modulator/demodulator to achieve a constant modulation rate that remains unchanged even if the information rate is increased.

2. Description of the Related Art

Generally, multiphase phase modulation or multilevel amplitude modulation allows $2^N$ signal points to be provided if the symbol of one signal point is N bits. By adding one redundancy bit, for example, to each N-bit symbol, there are available $2^{N+1}$ signal points arranged in two-dimensional space, and hence the number of signal points is doubled. The set of $2^{N+1}$ signal points is divided so that the Euclidean distance between any two signal points belonging to a subset is larger than the Euclidean distance between any two signal points in different subsets. To encode the signal points, a corresponding subset is selected using the state transition of a finite-state memory based on the transition between states so that only some sequences of signal points are effective. To decode the thus encoded signal sequences in a receiver, there is employed a Viterbi algorithm known as the maximum likelihood decoding process.

Heretofore, as shown in FIG. 6 of the accompanying drawings, a data transmission system of the type described above includes a transmitter comprising convolutional encoder 41, mapping circuit 42 for setting an arrangement of signal points, and 8-PSK (phase shift keying) modulator 43 for phase-modulating which is supplied with 8 signal points generated by $2^3$ bits, and a receiver comprising 8-PSK demodulator 44 and Viterbi decoder 45. Convolutional encoder 41 produces output signal points $Y_2$, $Y_1$, $Y_0$ that are mapped into the position shown in FIG. 4 of the accompanying drawings by mapping circuit 42 and then modulated by 8-PSK modulator 43 for transmission to a transmission path. The 8-phase-modulated signal, which contains noise added during transmission, is demodulated into m-bit soft decision I channel, Q channel (I-ch., Q-ch.) data by 8-PSK demodulator 44. The m-bit soft decision I-ch., Q-ch. data are supplied to Viterbi decoder 45, which produces estimated information data d.

Operation of convolutional encoder 41 will be described below with reference to FIG. 12 of the accompanying drawings. Convolutional encoder 41 is supplied with parallel information bits $X_1$, $X_2$ that have been converted by serial/parallel converter 101 connected to input terminals 77, 78 of convolutional encoder 41. If the encoding ratio is ⅔, then exclusive-OR gates 85, 86 of convolutional encoder 41 output exclusive-OR of information bits $X_1$, $X_2$ supplied from input terminals 77, 78 and output signals from shift registers 82, 83, and are stored in respective shift registers 83, 84. At this point, convolutional encoder 41 outputs, as coded data, output signals $Y_1$, $Y_2$ as respective information bits $X_1$, $X_2$ and redundancy bit $Y_0$ from respective output terminals 80, 79, 81. Each time information bits $X_1$, $X_2$ are inputted, convolutional encoder 41 repeats the above operation and produces output data $Y_1$, $Y_2$, $Y_0$. Output data $Y_1$, $Y_2$, $Y_0$ are then mapped into the positions shown in FIG. 4 by mapping circuit 42. If information bits $X_1$, $X_2$, $X_3$ inputted and the encoding ratio is ¾, then, assuming that convolutional encoder 41 is used, convolutional encoder 41 adds redundancy bit $Y_0$ depending on information bits $X_1$, $X_2$ to information bits $X_1$, $X_2$, $X_3$, and produces 4-bit output data. When information bit $X_3$ is an error-correcting bit, it should not be led into the convolutional encoding. Since one symbol is composed of the data $X_1$, $X_2$, $X_3$, $Y_0$, the 8 PSK modulator in the data transmission system shown in FIG. 6 cannot be used, and it is necessary to use a 16 QAM modulator adapted to a symbol composed of 4 bits, for example.

Operation of Viterbi decoder 45 will be described below with reference to FIGS. 9, 10, 11, and 13 of the accompanying drawings. FIG. 9 shows the trellis transition of convolutional encoder 41. FIG. 10 shows an ACS (add compare select) circuit composed of adders 50 through 53, comparator 54, and selector 55, and FIG. 11 also shows the ACS circuit. FIG. 13 shows Viterbi decoder 45. In FIG. 13, the m-bit soft decision I ch., Q ch. data decoded from an 8-PSK signal are supplied from input terminals 87, 88, respectively, to branch metric generator 89, which determines likelihood estimates (branch metrics) BM0, BM1, ..., BM7 between the 8-phase signal points and reception points as shown in FIG. 4. The likelihood estimates BM0, BM1, ..., BM7 are supplied to ACS circuit 90. To process a 0th state as shown in FIG. 10, branch and path metrics BM0', PM0, branch and path metrics BM2', PM2, branch and path metrics BM4', PM4, and branch and path metrics BM6', PM6 are added by respective adders 50, 51, 52, 53, and a path metric with maximum likelihood is calculated by comparator 54 and selected by selector 55 as a path metric PM0 on the next occasion. It is assumed that a path that has transited from a 4th state is selected. Upon selection of the path, the history data of the path stored in 4th-state shift register 75 (see FIG. 11) in path memory 91 is shifted to the right into 0th-state shift registers 73 by select signals SEL0 applied to selectors 56, 60, 64, 68, so that 0th-state shift registers 73 store two information bits "01" that are a transition output. Similarly, the above operation is simultaneously carried out with respect to the 1st, 2nd, ..., 7th states by circuits based on the trellis transition shown in FIG. 9. Each time a received symbol is inputted, path metrics PM0~PM7 with maximum likelihood are detected by maximum likelihood decider 92, and the output signal from the final shift register which represents the state of the most likelihood path is selected by selector 72, thus producing estimates $X_2$, $X_1$ indicative of estimated decoded bits.

With the conventional data transmission system described above, if the encoding ratio is ⅔, then an 8-PSK modulator/demodulator may be used. However, if the encoding ratio is ¾, then a 16-QAM modulator/demodulator has to be used. Therefore, the conventional coding modulation process cannot employ the same modulator/demodulator when the information rate is increased with the modulation rate being kept constant.

SUMMARY OF THE INVENTION

It is therefore an object of the present invention to provide a method of data transmission for transmitting data by adding a redundancy bit produced by a convolutional encoder and for receiving and decoding inputted data by selecting a maximum likelihood value using a Viterbi decoder, comprising the steps of:

on the transmitter side:

converting serial signal data bits to sets of a predetermined number of parallel data bits;

periodically selecting an encoded signal composed of a first data sequence signal, which is a set of said parallel data without a specific bit and with a redundancy bit in place of the specific bit, and a second data sequence signal composed of another set of the parallel data;

mapping said selected signal onto a two dimensional field having predetermined transmitting signal points, and modulating and transmitting I-channel and Q-channel soft decision data;

on the receiver side:

receiving and demodulating the I-channel and Q-channel soft decision data;

generating branch metric data to calculate the likelihood of received data based upon a received signal point on the two dimensional field;

comparing branch metric data within the same group which includes branch metric data of point symmetric branches established for the received second data sequence signal, rearranging said branch metric data for a second data sequential signal;

periodically selecting from the rearranged branch metric data and branch metric data for the encoded signal according to a predetermined sequence;

adding the selected branch metric data and maximum path metric data for the preceding time, comparing the added result and selecting maximum likelihood path metric data from the result of the comparison;

storing the maximum path metric data, outputting an likelihood estimated decoded bit from the stored maximum path metric data by detecting the maximum likelihood path metric data at the current time;

holding the added bits of each transmitting signal point corresponding to each represented branch metric of each group until corresponding estimated decoding bits are outputted;

selecting the estimated added bit of the second data sequence signal from said held added bits of each represented branch metric; and converting the estimated decoded bits and the selected estimated added bit of the second data sequence signal into a serial data sequence.

It is another object of the present invention to provide a data transmission system providing a transmitter transmitting data by adding a redundancy bit produced by a convolutional encoder and a receiver decoding by selecting the maximum likelihood data using a Viterbi decoder:

said transmitter comprising:

serial to a parallel converting means for converting; serial data into set of parallel data;

convolutional encoding means for outputting a redundant bit which is added to compose a set of parallel data as a first data sequence signal which is an encoded signal, selecting means for alternately selecting, the encoded first data sequence signal and a second data sequence signal which is another set of parallel data including the specific bit of the data without a redundancy bit;

means for mapping the signal selected by the selecting means onto a two-dimensional signal point;

multiphase PSK modulating means which is a phase shift keying modulator for modulating two-dimensional signal point I-channel and Q-channel soft decision data which are quantumization level data for discrimination of a signal; and transmitting means for transmitting modulated data;

the receiver comprising:

receiving means for receiving the transmitted data, multiphase PSK demodulating means for demodulating received data into two-dimensional I-channel and Q-channel soft decision data;

generating means for generating branch metric data which express likelihood of received signal point to each transmitting signal point;

comparing means for comparing branch metric data within the same group which includes branch metric data of point symmetric branches corresponding to each received second data sequence signal;

first selecting means for selecting branch metric data which are reconstructed based on output data from the comparing means;

second selecting means for periodically selecting the selected branch metric data from said first selecting means and branch metric data corresponding to the encoded signal;

an add-compare-select circuit for adding the selected branch metric data from the second selecting means to maximum likelihood path metric data of a path stored until a previous time, and selecting a path with the maximum likelihood by comparing the added results;

a path memory circuit for storing the maximum likelihood path metric data up to the previous time;

a maximum likelihood path decider for determining a path metric with the maximum likelihood at the current time;

maximum likelihood path determining means for outputting the estimated value of decoded bits at the current time from said path memory based on path metric information from the maximum likelihood path decider;

holding means for holding and outputting the signal from the comparing means for a predetermined period of time corresponding to the period of time during which data pass through said maximum likelihood path determining means;

third selecting means for selecting an estimated additional bit for said second data sequence signal from the output signal from the holding means under the control of the output signal of the maximum likelihood path determining means; and parallel to series converting means for converting the output signal from the maximum likelihood path determining means and the output signal from the third selecting means, which are inputted parallelly, into serial data.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 7 is a second timing chart of an operation sequence of the data transmission system according to the present invention;

FIG. 8 is a third timing chart of an operation sequence of the data transmission system according to the present invention;

FIG. 12 is a block diagram of a conventional convolutional encoder;

FIG. 14 is a block diagram of a convolutional encoder in the data transmission system according to the present invention.

DETAILED DESCRIPTION OF THE PREFERRED EMBODIMENT

Figure 1:
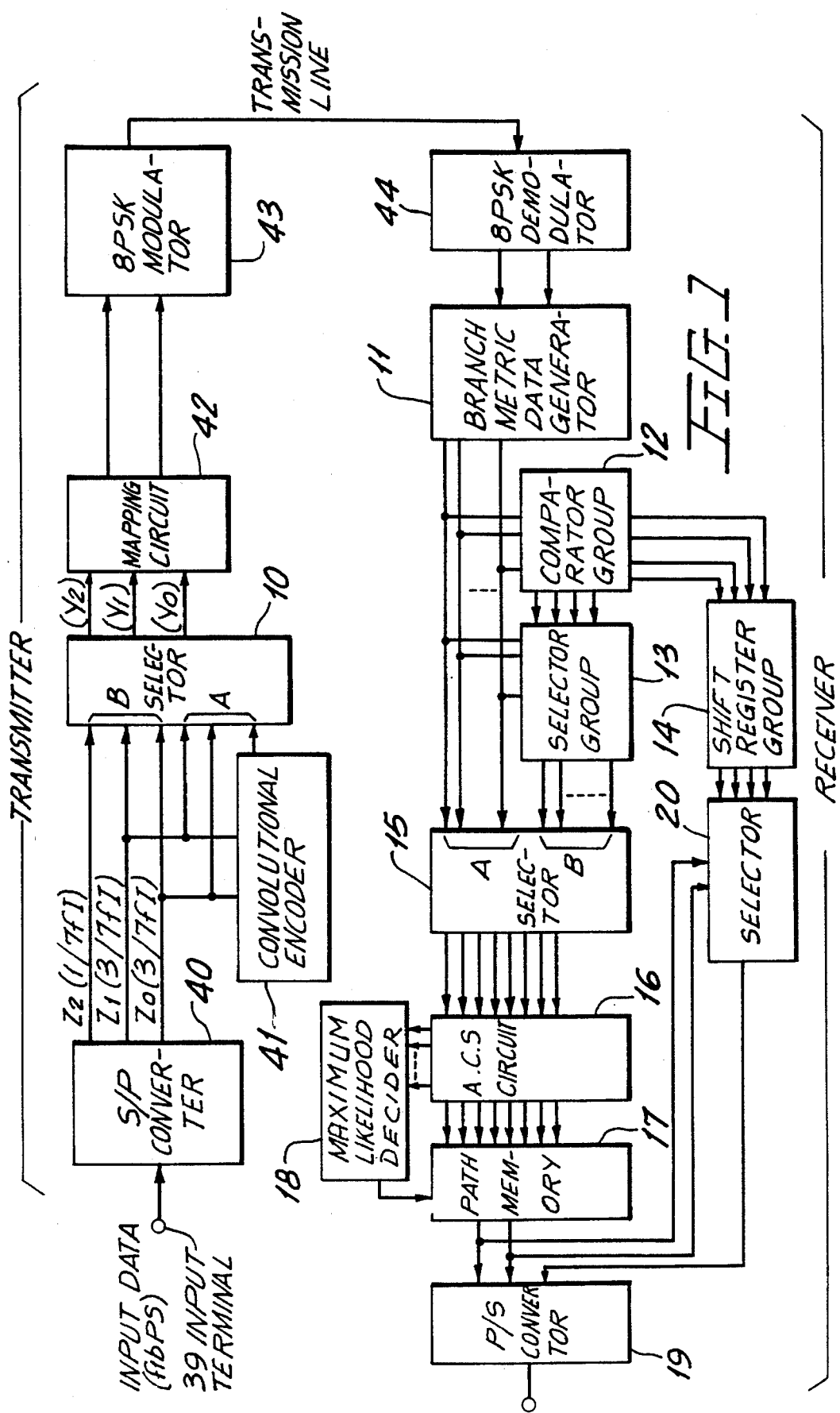
FIG. 1 is a block diagram of a data transmission system according to the present invention.
Figure 2:
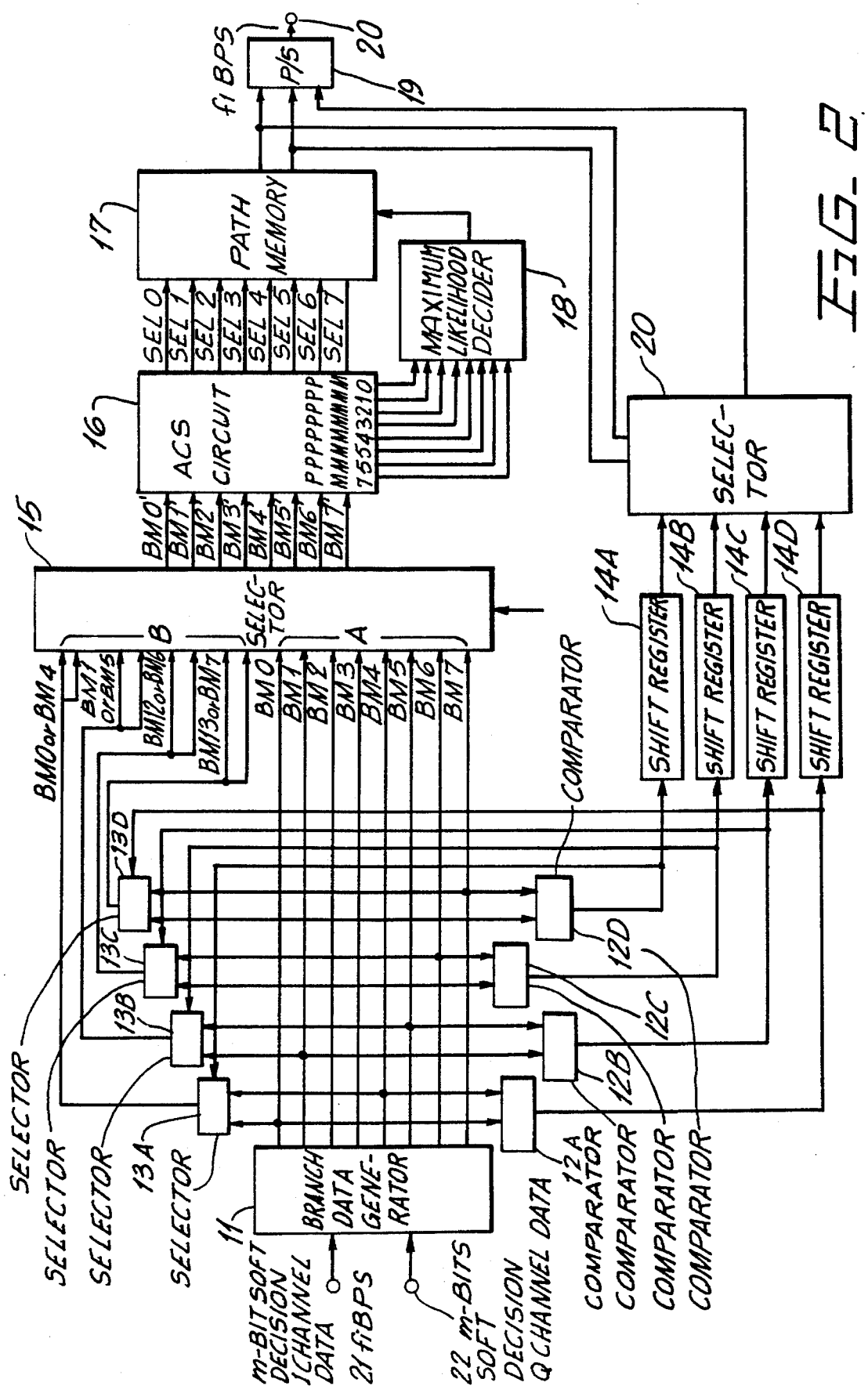
FIG. 2 is a block diagram of a decoder in the data transmission system according to the present invention.

FIG. 1 shows a block diagram of a data transmission system according to the present invention. FIG. 2 shows a block diagram of a decoder for decoding a data sequence in a receiver of the data transmission system according to the present invention.

As shown in FIG. 1, the data transmission system includes a transmitter having a serial/parallel converter 40 data for converting a signal sequence supplied at a bit rate of $f_1$ bps (bits per second) from input terminal 39 into three data sequences $Z_2$, $Z_1$, $Z_0$. The data sequences $Z_2$, $Z_1$, $Z_0$ have respective bit rates $f_1/7$, $3f_1/7$, $3f_1/7$ bps. Data sequences $Z_1$, $Z_0$ are supplied to a convolutional encoder 41 having an encoding ratio of 2/3 at each period of $3f_1/7$. As shown in FIG. 14, convolutional encoder 41 is of an arrangement identical to the conventional convolutional encoder shown in FIG. 12. In FIG. 14, data sequence $Z_0$ and the output signal from shift register 31, and data sequence $Z_1$ and the output signal from shift register 32 are supplied to respective exclusive-OR gates 34, 35, whose output signals are supplied respectively to shift registers 32, 33. Shift register 33 applies output signal P, indicative of a redundant bit, to shift register 31. Convolutional encoder 41 produces data sequence $Z_1$, $Z_0$ and redundant bit P as its output data. The data sequences $Z_2$, $Z_1$, $Z_0$ from serial/parallel converter 40 or output data $Z_1$, $Z_0$, P from convolutional encoder 41 are selected as output data $Y_2$, $Y_1$, $Y_0$ by selector 10. As a result, the encoding ratio is 7/9. In terms of a conventional data transmission system, the bit rate is $(6/7)f_1$ bps. The modulation rate is $(3/7)f_1$ baud for both the data transmission system according to the present invention and the conventional data transmission system, and hence remains unchanged in spite of raising the bit rate.

Figure 3:
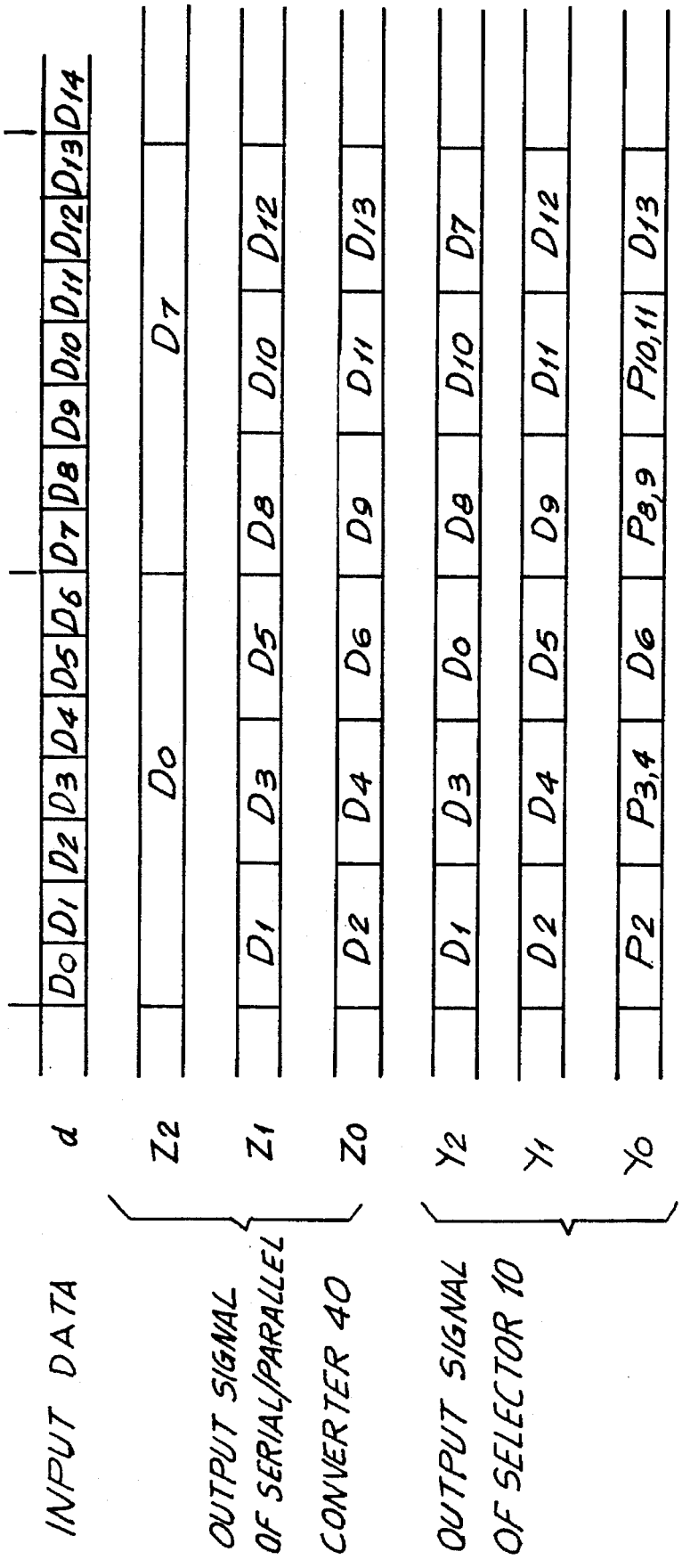
FIG. 3 is a first timing chart of an operation sequence of the data transmission system according to the present invention.

A timing chart of the above processing operation is illustrated in FIG. 3. Data sequence d composed of data $D_0$, $D_1$, ... $D_6$; $D_7$, $D_8$ ... $D_{13}$; ... is divided into data sequence $Z_2$ of $D_0$, $D_7$, ..., data sequence $Z_1$ of $D_1$, $D_3$, $D_5$, $D_8$, $D_{10}$, $D_{12}$, ..., and data sequence $Z_0$ of $D_2$, $D_4$, $D_6$, $D_9$, $D_{11}$, $D_{13}$, .... Selector 10 selects output signals $D_1$, $D_2$, $P_{1,2}$ from convolutional encoder 41, then output signals $D_3$, $D_4$, $P_{3,4}$ from convolutional encoder 41, and finally output signals $D_0$, $D_5$, $D_6$ which are a combination of data sequences $Z_2$, $Z_1$, $Z_0$. Even though redundancy bit $P_{5,6}$ obtained based on output signals $D_5$, $D_6$ is discarded and output signals $D_0$, $D_5$, $D_6$ are transmitted, the conventional Viterbi decoder in the receiver can decode signals $D_0$, $D_5$, $D_6$, with slight signal deterioration, based on the decoding method for $D_0$. A process of giving branch metrics will be described below. The above operation is repeated by selector 10 to output signals.

Figure 4:
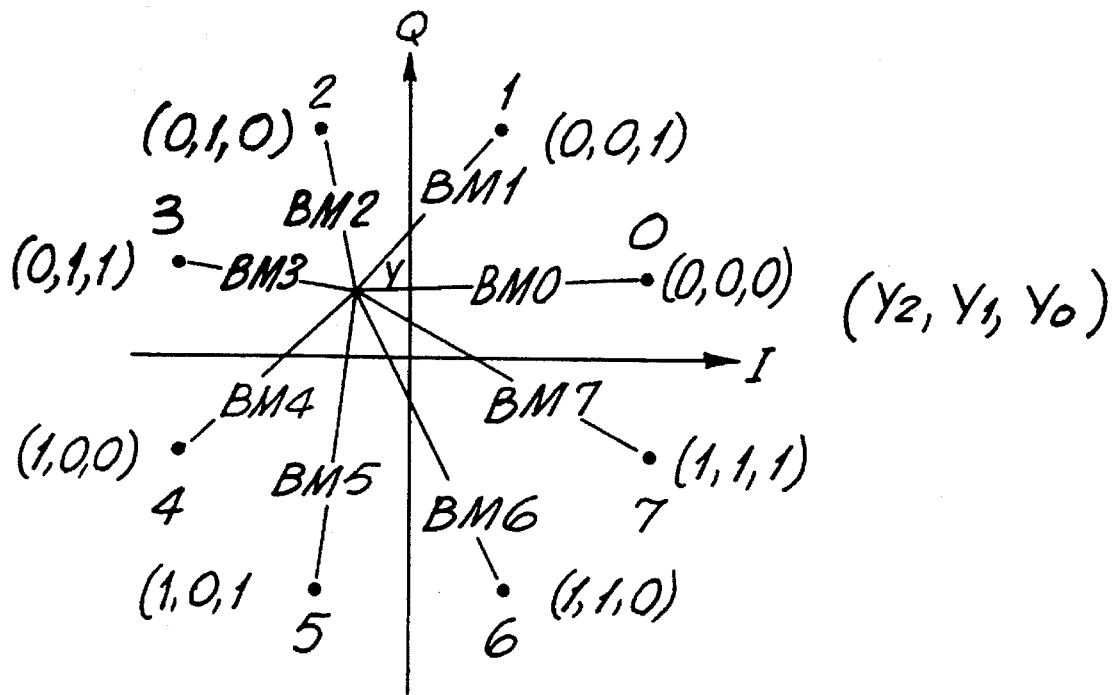
FIG. 4 is a diagram illustrative of signal points applied to the present invention and to a conventional data transmission system.
Figure 9:
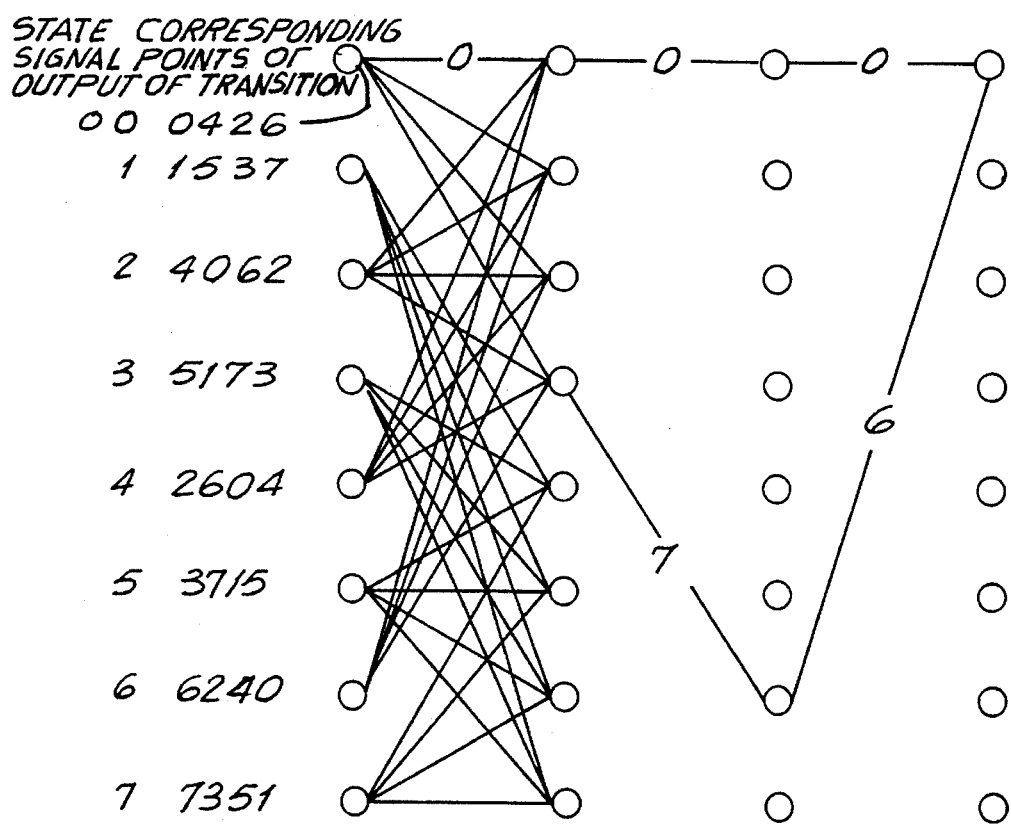
FIG. 9 is a diagram showing a general trellis transition with an encoding ratio of 2/3.
Figure 10:
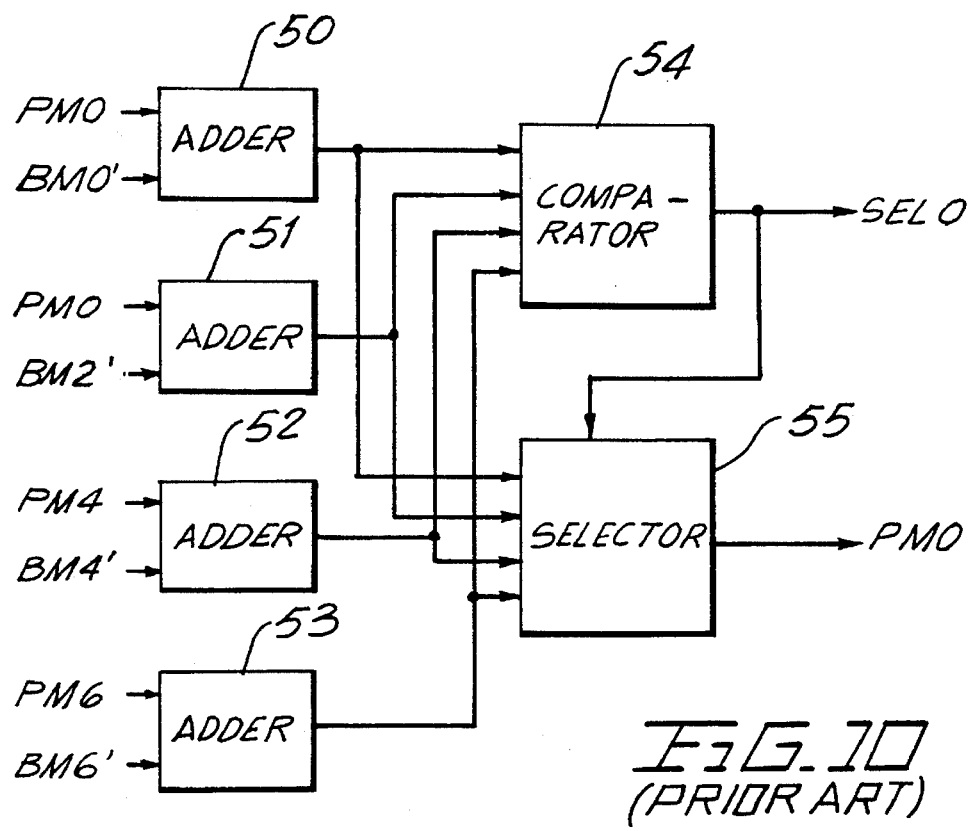
FIG. 10 is a block diagram of a general ACS circuit.
Figure 11:
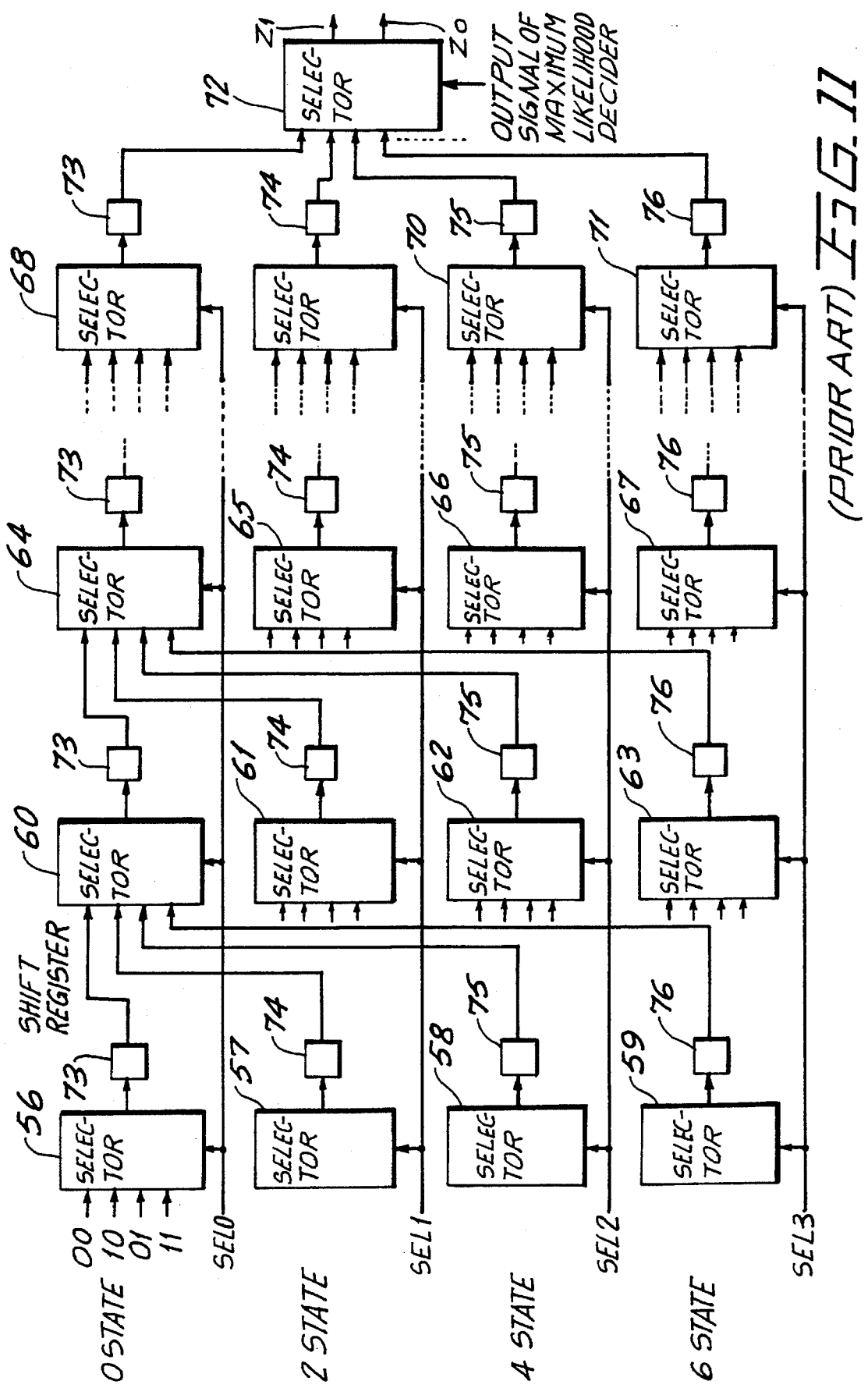
FIG. 11 is a block diagram for selection sequence of a general ACS circuit.

Operation of a Viterbi decoder in a receiver of the data transmission system will be described below with reference to FIG. 2. m-bit soft decision I-channel and Q-channel data $r=(r_I, r_Q)$ are supplied from respective input terminals 21, 22 to branch metric generator 11, which determine likelihood estimates (branch metrics) BM0, BM1, ..., BM7 between 8-phase signal points and received point as shown in FIG. 4. If a symbol that has been received first contains a redundancy bit outputted from convolutional encoder 41, then selector 15 selects an A side and outputs branch metrics BM0', BM1', ..., BM7', which are supplied to ACS circuit 16. As shown in FIG. 9, the horizontal rows of the trellis diagram represent 8 states, i.e., 0th through 7th states. The 0th state is the point where paths that have transited from the 0th, 2nd, 4th, 6th states are joined to each other, and the signal points corresponding to transition outputs according to each potential pair of input bits $Z_0$, $Z_1$ are 0, 4, 2, 6. Therefore, as shown in FIG. 10, ACS circuit 16 processes the 0th state by adding branch and path metrics BM0', PM0, branch and path metrics BM4', PM2, branch and path metrics BM2', PM4, and branch and path metrics BM6', PM6 with respective adders 50, 51, 52, 53, calculating the path metric with maximum likelihood with comparator 54, and selecting it with selecter 55 as path metric PM0 at the next occasion. It is assumed that a path that has transited from the 4th state is selected. Upon selection of the path, the history data of the path stored in 4th-state shift registers 75 (see FIG. 11) in path memory 91 is shifted to the right into 0th-state shift registers 73 by select signals SEL0 applied to selectors 56, 60, 64, 68, so that 0th-state shift registers 73 store two information bits "01" that are the transition output. Similarly, the above operation is simultaneously carried out with respect to the 1st, 2nd, ..., 7th states by circuits based on the trellis transition shown in FIG. 9. Each time a received symbol is inputted, path metrics PM0–PM7 with maximum likelihood are detected by maximum likelihood decider 18, and the output signal from the final shift registers which represents the state of the maximum likelihood path is selected by selector 72, thus producing estimates $Z_2$, $Z_1$ indicative of estimated decoded bits.

A decoding process for data from which a redundancy bit has been removed and to which information bit D0 has been added will be described below. As described above, transmitted symbols $Y_2$, $Y_1$, $Y_0$ are output signals from a convolutional encoder and are mapped into points in a two-dimensional coordinate system $(S_I, S_Q)$. For a received symbol with no redundancy bit removed therefrom, branch metrics between received points $(r_I, r_Q)$ and 8 signal points (0–7) above can be calculated as BM0'–BM7' in the same manner as heretofore. However, branch metrics for data from which a redundancy bit has been discarded and to which an information bit has been added are calculated in a different way. Since data ($D_{n-5}$, $D_n$, $D_{n+1}$) are transmitted instead of data ($D_n$, $D_{n+1}$, $P_{n,n+1}$), the transmitted data must be converted back to data ($D_n$, $D_{n+1}$, $P_{n,n+1}$). Since data $P_{n,n+1}$ is unknown, the transmitted symbol may be either ($D_n$, $D_{n+1}$, 0) or ($D_n$, $D_{n+1}$, 1). As data ($D_n$, $D_{n+1}$) take values of 0, 1, the transmitted symbol is estimated to be one of four groups {(0,0,0), (0,0,1)}, {(0,1,0), (0,1,1)}, (1,0,1)}, {(1,1,0), (1,1,1)}.

Figure 5:
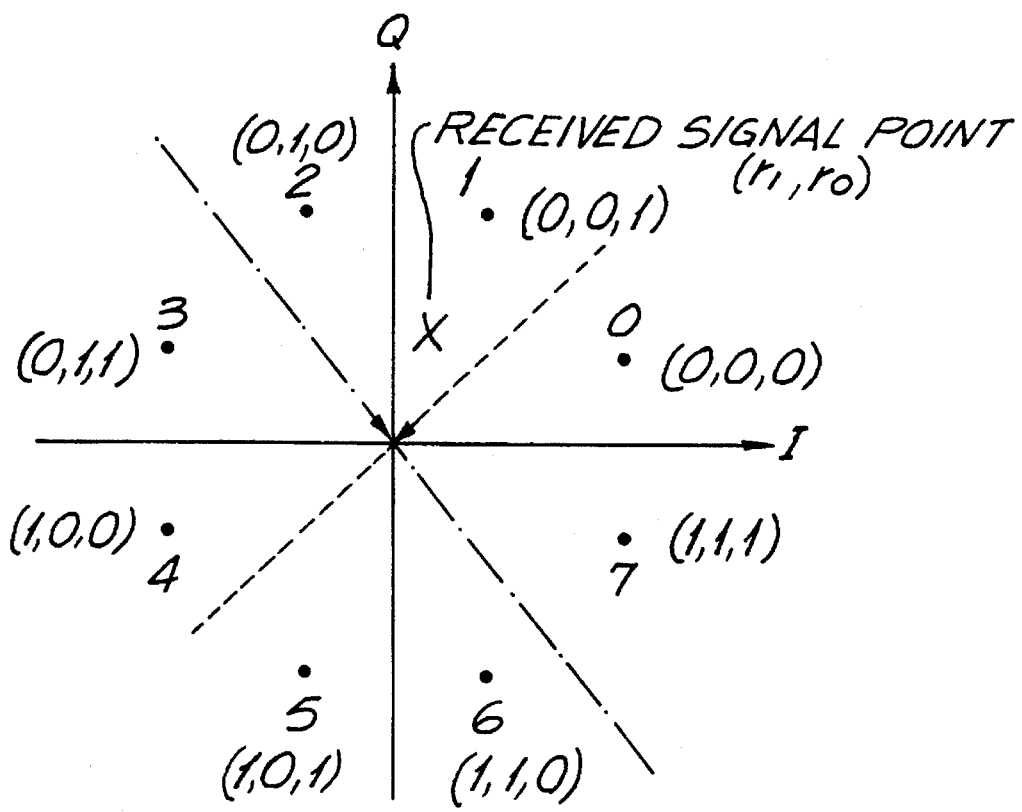
FIG. 5 is a diagram illustrative of signal points applied to the present invention.
Figures 6, 13:
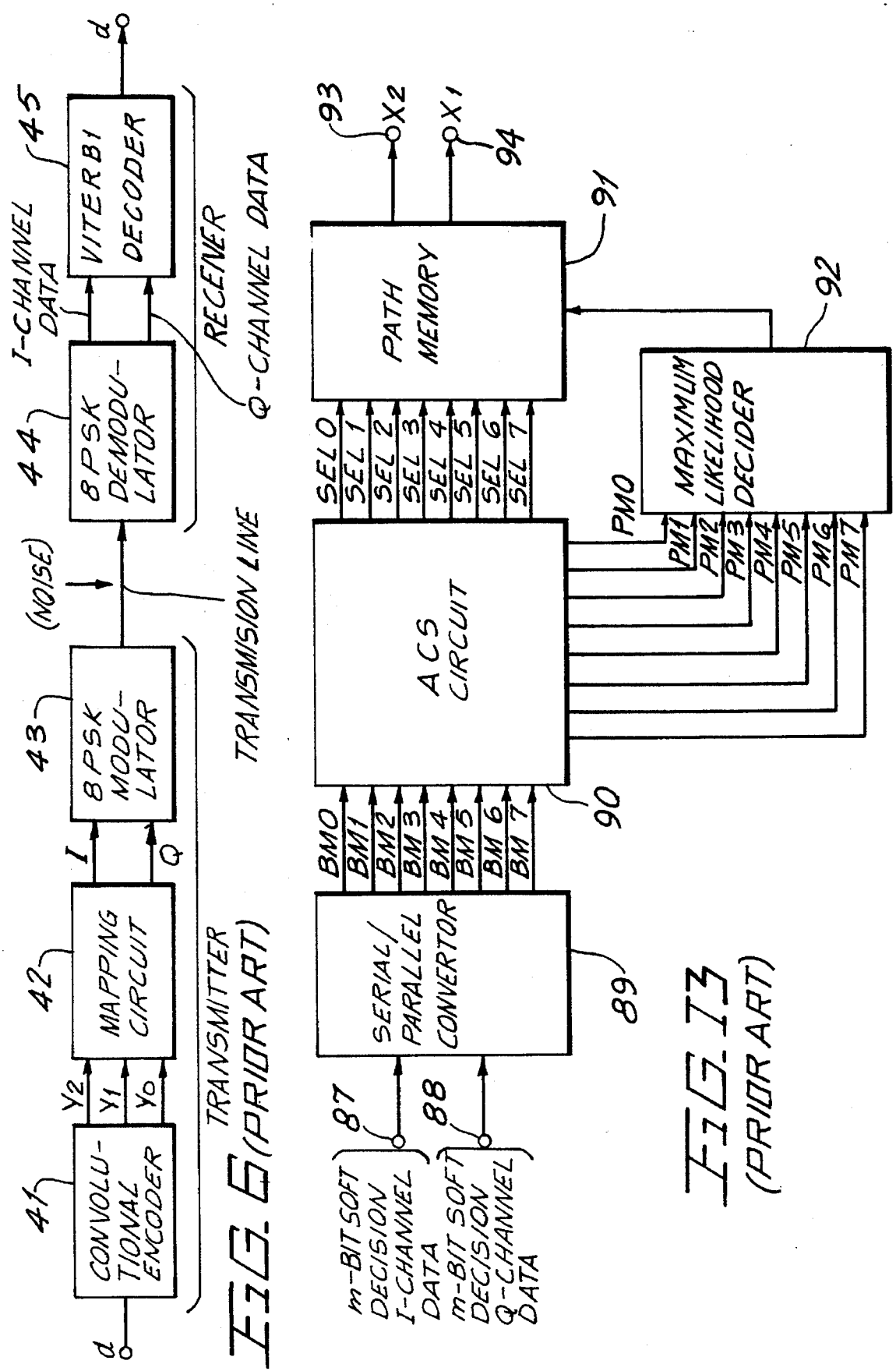
FIG. 6 is a block diagram of a conventional data transmission system.
FIG. 13 is a block diagram of a conventional Viterbi decoder.

The process of determining branch metrics for data with reception points positioned as shown in FIG. 5 and from which redundancy bits have been removed and to which an information bit has been added will be described below. The symbol of received signal point r is estimated to be (0,0,1) by a comparison procedure using a threshold value. As it cannot be ascertained which symbol of the groups is transmitted, it is reasonable to assume that the actual branch metrics are of the same value. The possibility that the transmitted symbol will belong to one of groups {(0,0,0), (0,0,1)}, {(0,1,0), (0,1,1)}, {(1,0,0), (1,0,1)}, {(1,1,0), (1,1,1)} can be determined. The branch metrics are given as BM0~BM7 even when the transmitted symbol is ($D_{n-5}$, $D_n$, $D_{n+1}$). For example, BM3 is a branch metric with respect to received symbol (0,0,1) and symbol (0,1,1) of signal point 3, and represents the possibility that symbol (0,1,1) will change to symbol (0,0,1) due to noise. Inasmuch as BM3 contains the possibility that it becomes underscored data of symbol (0,1,1), it can be used as a branch metric when it is assumed that the transmitted symbol is {(1,1,0), (1,1,1)}. BM7 represents the possibility that symbol (1,1,1) will change to symbol (0,0,1) due to noise and also the possibility that it becomes underscored data of symbol (1,1,1). Therefore, both BM3, BM7 are branch metrics indicating the possibility that the transmitted symbol is {(1,1,0), (1,1,1)}. Whichever is greater (MAX {BM3, BM7}) is branch metric BM6' with respect to (1,1,0), and branch metric BM7' with respect to (1,1,1). Likewise, for group {(0,0,0), (0,0,1)}, whichever is greater of BM0, BM4 becomes BM0' with respect to (0,0,0), and BM1' with respect to (0,0,1). For the group {(0,1,0), (0,1,1)}, whichever is greater BM1, BM5 becomes BM2' with respect to (0,1,0), and BM3' with respect to (0,1,1). For the group {(1,0,0), (1,0,1)}, whichever is greater BM2, BM6 becomes BM4' with respect to (1,0,0), and BM5' with respect to (1,0,1). One of BMi, BM(i+4) (i=0, 1, 2, 3) in each group may be selected by comparing the magnitudes of BMi, BM(i+4) with comparators 6, 7, 8, 9 shown in FIG. 2 and selecting the greater magnitude with selectors 13A, 13B, 13C, 13D. At this point, selector 15 selects a B side. The timing to select the A and B sides with selector 15 is shown in FIG. 7. Once BM0'~BM7' are determined, ACS circuit 16, maximum likelihood decider 18, and path memory 17 shown in FIG. 2 are operated. Select signals produced by comparators 12A~12D are supplied to shift registers 14A~14D to estimate additional bit $Z_2$.

The related operation of shift registers 14A~14D and selector 20 will be described below. For transmitted symbol ($D_{n-5}$, $D_n$, $D_{n+1}$) from which a redundancy bit has been removed, decoding $D_n$, $D_{n+1}$ is possible by generating BM0'~BM7' from BM0~BM7 and supplying generated BM0'~BM7' to the ACS circuit. However, it is necessary to employ another processing circuit for $D_{n-5}$ since it is not decoded by the Viterbi decoder. In the process of decoding $D_n$, $D_{n+1}$ with the Viterbi decoder, the ACS circuit is supplied with transmitted data ($D_n$, $D_{n+1}$) which may be one of (0,0), (0,1), (1,0) and (1,1). A candidate for $D_{n-5}$ is depending on the combinations of (0,0), (0,1), (1,0) and (1,1), i.e., the signal points of groups {(0,0,0), (1,0,0)}, {(0,0,1), (1,0,1)}, { (0,1,0), (0,1,1)}, {(0,1,1), (1,1,1)}(underscored data corresponds to $\overline{D_n, D_{n+1}}$) are compared with the received points, and closer signal points are selected. The candidate for $D_{n-5}$ in each group selected by comparators 12A~12D is delayed by shift registers 14A~14D, and one of the output signals from shift registers 14A~14D which corresponds to the pair of estimated values $Z_1$, $Z_0$ ($D_n$, $D_{n+1}$) decoded by the Viterbi decoder becomes estimated value $Z_2$ for $D_{n-5}$.

With the present invention, as described above, the transmitter includes an encoder whose encoding ratio is rendered variable by alternating two data signal outputs, i.e., a signal output with a redundant bit from a conventional convolutional encoder and a signal output with an information bit, at certain constant intervals, and the receiver includes a function for executing a Viterbi algorithm corresponding to a conventional convolutional encoder and a function for reconstructing a branch metric corresponding to a data signal of a received symbol with respect to only the output of an information bit and estimating estimated value $Z_2$ of ($Z_2$, $Z_1$, $Z_0$). The data transmission system according to the present invention can thus increase the information rate while keeping the modulation rate constant, using an existing data transmission line with the same modulator/demodulator. Since the ACS circuit and the path memory can be shared with respect to the Viterbi decoder, the data transmission system lends itself to being manufactured as an LSI circuit. Since a data signal with a variable bit rate can be transmitted using the same data transmission line, the present invention is highly advantageous in effectively utilizing any data transmission line in use.

Although a certain preferred embodiment of the present invention has been shown and described in detail, it should be understood that various changes and modifications may be made therein without departing from the scope of the appended claims.

What is claimed is:

1. A method of data transmission for transmitting data by adding a redundancy bit produced by a convolutional encoder and for receiving and decoding inputted data by selecting a maximum likelihood value using a Viterbi decoder, comprising the steps of:

on the transmitter side:

converting serial signal data bits to sets of a predetermined number of parallel data bits;

periodically selecting an encoded signal composed of a first data sequence signal which is a set of said parallel data without a specific bit and with a redundancy bit in place of said specific bit, and a second data sequence signal composed of another set of said parallel data;

mapping said selected signal onto a two dimensional field having predetermined transmitting signal points; and modulating and transmitting I channel and Q channel soft decision data;

on the receiver side:

receiving and demodulating said I channel and Q channel soft decision data;

generating branch metric data to calculate the likelihood of received data based upon a received signal point on said two dimensional field;

comparing branch metric data within the same group which includes branch metric data of point symmetric branches established for said received second data sequence signal;

rearranging said branch metric data for a second data sequential signal;

periodically selecting from said rearranged branch metric data and branch metric data for said encoded signal according to a predetermined sequence;

adding said selected branch metric data and maximum likelihood path metric data for the preceding time, comparing the added result and selecting maximum likelihood path metric data from the result of the comparison;

storing said maximum path metric data;

outputting an estimated decoded bit from said stored maximum likelihood path metric data by detecting the maximum likelihood path metric data at the current time;

holding said added bits of each transmitting signal point corresponding to each represented branch metric of each group until corresponding estimated decoding bits are outputted;

selecting the estimated added bit of said second data sequence signal from said held added bits of each represented branch metric; and converting said estimated decoded bits and said selected estimated added bit of said second data sequence signal into a serial data sequence.

2. A data transmission system providing a transmitter transmitting data by adding a redundancy bit produced by a convolutional encoder and a receiver decoding by selecting the maximum likelihood data using a Viterbi decoder:

the transmitter comprising:

serial to parallel converting means for converting serial data into sets of parallel data;

convolutional encoding means for outputting a redundant bit which is added replacing with a specific bit to compose a set of parallel data as a first data sequence signal which is an encoded signal;

selecting means for alternately selecting, said encoded first data sequence signal and a second data sequence signal which is another set of parallel data including said specific bit of the data without a redundancy bit;

means for mapping the signal selected by said selecting means onto a two-dimensional signal point;

multiphase PSK modulating means which is a phase shift keying modulator for modulating two-dimensional signal point I-channel and Q-channel soft decision data which are quantumization level data for discrimination of a signal; and transmitting means for transmitting modulated a path memory circuit for storing said maximum likelihood path metric data up to the previous time;

a maximum likelihood path decider for determining a path metric with the maximum likelihood at the current time;

maximum likelihood path determining means for outputting the estimated value of decoded bits at the current time from said path memory based on path metric information from said maximum likelihood path decider;

holding means for holding and outputting the signal from said comparing means for a predetermined period of time corresponding to the period of time during data pass through said maximum likelihood path determining means;

third selecting means for selecting an estimated additional bit for said second data sequence signal from said output signal from said holding means under the control of said output signal of said maximum likelihood path determining means; and parallel to serial converting means for converting the output signal from said maximum likelihood path determining means and the output signal from said third selecting means, which are inputted parallelly, into serial data.

* * * * *